(12) United States Patent
Okawa et al.

(10) Patent No.: US 12,369,251 B2
(45) Date of Patent: Jul. 22, 2025

(54) OPTICAL COMMUNICATION MODULE SUBSTRATE

(71) Applicant: NITTO DENKO CORPORATION, Ibaraki (JP)

(72) Inventors: Tadao Okawa, Ibaraki (JP); Takashi Oda, Ibaraki (JP); Masataka Yamaji, Ibaraki (JP); Kazushi Ichikawa, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 212 days.

(21) Appl. No.: 18/009,063

(22) PCT Filed: Jun. 21, 2021

(86) PCT No.: PCT/JP2021/023349
§ 371 (c)(1),
(2) Date: Dec. 8, 2022

(87) PCT Pub. No.: WO2021/261428
PCT Pub. Date: Dec. 30, 2021

(65) Prior Publication Data
US 2023/0254973 A1 Aug. 10, 2023

(30) Foreign Application Priority Data
Jun. 22, 2020 (JP) ................. 2020-107046

(51) Int. Cl.
*H05K 1/11* (2006.01)
*G02B 6/12* (2006.01)
(Continued)

(52) U.S. Cl.
CPC .............. *H05K 1/117* (2013.01); *G02B 6/12* (2013.01); *G02B 6/4214* (2013.01);
(Continued)

(58) Field of Classification Search
CPC .................. G02B 6/4274–4284; H05K 1/117
See application file for complete search history.

(56) References Cited

U.S. PATENT DOCUMENTS 9,544,057 B2   1/2017  Kaikkonen et al.
9,651,751 B1   5/2017  Ding et al.
(Continued)

FOREIGN PATENT DOCUMENTS

JP   2004-363205 A   12/2004
JP   2007-123740 A    5/2007
(Continued)

OTHER PUBLICATIONS

Notification of Transmittal of Copies of Translation of the International Preliminary Report on Patentability (Form PCT/IB/338) issued in counterpart International Application No. PCT/JP2021/023349 mailed Jan. 5, 2023, with Forms PCT/IB/373 and PCT/ISA/237. (6 pages).

(Continued)

*Primary Examiner* — Rhonda S Peace
(74) *Attorney, Agent, or Firm* — WHDA, LLP

(57) ABSTRACT

An optical communication module substrate includes a wiring board and an opto-electronic hybrid substrate, the wiring board and the opto-electronic hybrid substrate being connected to each other, in which a connection terminal of the wiring board and a connection terminal of the opto-electronic hybrid substrate are electrical connection points, and a frame-shaped removal portion is formed by removing a portion of the metal reinforcing layer of the opto-electronic hybrid substrate that faces the connection terminal with the insulating layer interposed between the metal reinforcing layer and the connection terminal, so as to surround each terminal. According to this configuration, the connection strength at the connection point between the wiring board and the opto-electronic hybrid substrate is sufficiently (Continued)

ensured, and the optical communication module substrate has excellent electrical properties that are compatible with high-speed signal transmission.

5 Claims, 9 Drawing Sheets

(51) Int. Cl.
   *G02B 6/42* (2006.01)
   *H05K 1/02* (2006.01)
   *H05K 1/14* (2006.01)

(52) U.S. Cl.
   CPC ............ *G02B 6/4274* (2013.01); *G02B 6/428* (2013.01); *H05K 1/0271* (2013.01); *H05K 1/144* (2013.01); *H05K 2201/041* (2013.01); *H05K 2201/10121* (2013.01); *H05K 2201/1034* (2013.01)

(56) References Cited

U.S. PATENT DOCUMENTS

| | | | |
|---|---|---|---|
| 9,923,636 | B2 | 3/2018 | Kaikkonen et al. |
| 10,353,161 | B2* | 7/2019 | Tsujita .................... G02B 6/13 |
| 11,382,212 | B2 | 7/2022 | Sasagawa et al. |
| 2002/0012885 | A1 | 1/2002 | Steinberg et al. |
| 2004/0246626 | A1 | 12/2004 | Wakaki et al. |
| 2009/0225268 | A1 | 9/2009 | Yokota |
| 2012/0183781 | A1 | 7/2012 | Chuma et al. |
| 2014/0085856 | A1 | 3/2014 | Shirao et al. |
| 2017/0285284 | A1 | 10/2017 | Tsujita et al. |
| 2018/0011264 | A1* | 1/2018 | Uchiyama ............ G02B 6/4204 |
| 2020/0064971 | A1 | 2/2020 | Suto |
| 2023/0092821 | A1* | 3/2023 | Karhade .............. G02B 6/3897 385/14 |
| 2023/0254973 | A1* | 8/2023 | Okawa ................. G02B 6/4274 361/803 |
| 2023/0258893 | A1* | 8/2023 | Okawa ................... G02B 6/428 385/14 |

FOREIGN PATENT DOCUMENTS

| | | |
|---|---|---|
| JP | 2014-82455 A | 5/2014 |
| JP | 2016-85314 A | 5/2016 |
| JP | 2016-540388 A | 12/2016 |
| TW | 200951904 A | 12/2009 |
| TW | 201124442 A | 7/2011 |
| TW | 201837679 A | 10/2018 |
| TW | I670999 B | 9/2019 |

OTHER PUBLICATIONS

International Search Report dated Aug. 31, 2021, issued in counterpart International Application No. PCT/JP2021/023349, w/English translation (5 pages).
Office Action dated Sep. 12, 2024, issued in counterpart TW Application No. 110122524, with English translation. (13 pages).
Office Action dated Dec. 3, 2024, issued in JP Application No. 2022-531964, with English translation. (7 pages).
Office Action dated Mar. 4, 2025, issued in counterpart JP Application No. 2022-531964, with English translation. (6 pages).

* cited by examiner

RELATED ART

RELATED ART

RELATED ART

RELATED ART

RELATED ART

OPTICAL COMMUNICATION MODULE SUBSTRATE

TECHNICAL FIELD

The present disclosure relates to an optical communication module substrate obtained by connecting a wiring, board (that includes a wiring circuit board) and an opto-electronic hybrid substrate, and specifically to an optical communication module substrate having excellent reliability for high-frequency signals.

BACKGROUND ART

Accompanying an increase in the amount of information to be transmitted, optical wires are used in addition to electric wires in recent electronic devices, and opto-electronic hybrid substrates with compact arrangement of electric wires and optical wires are widely used. Further, an optical communication module etc. that performs high-speed signal transmission by further connecting the above opto-electronic hybrid substrate to a wiring board having the function to transmit signals to various electronic devices or the like is also widely used.

FIG. 13 schematically shows an example of such an optical communication module. The optical communication module is obtained by connecting an opto-electronic hybrid substrate 2 to a wiring board 1 into a single body, and more specifically, first, the surface of the wiring board 1 is provided with electric wirings X in which a plurality of pairs of wires for differential signal transmission are arranged.

Also, the opto-electronic hybrid substrate 2 includes an insulating layer 3 (indicated by rough hatching in FIG. 13) provided with a wide portion and a narrow portion, and an electric circuit portion 6 that includes electric wiring Y in which a plurality of pairs of wires for differential signal transmission are arranged, an optical element 4, an IC 5 for driving the optical element 4, and the like is provided on the back side surface of the wide portion of the insulating layer 3, i.e., a surface that overlaps the front surface of the wiring board 1. Further, a metal reinforcing layer 7 for reinforcing the electric circuit portion 6 is provided on the front side surface of the insulating layer 3, and a strip-shaped optical waveguide 8 is provided on the front side surface of the insulating layer 3 such that the optical waveguide 8 partially overlaps the metal reinforcing layer 7.

In the optical communication module, electrical connection between the wiring board 1 and the opto-electronic hybrid substrate 2 is achieved by, as shown in FIG. 14 which schematically shows an enlarged view of the electrical connection, arranging connection terminals provided at an end portion of the electric wirings X and an end portion of the electric wirings Y such that the connection terminals overlap each other, and connecting the connection terminals using solder bumps, or the like. Each connection point is indicated by P in the drawings.

If a board and a substrate are to be electrically connected as in the above optical communication module, it is important to control impedance at the connection points P. This is because, if there is a mismatch in the impedance at the connection points P, the signal transmission efficiency may be significantly reduced due to the effects of the mismatch in the impedance, because, in particular, fine-pitch wiring for transmitting the above-mentioned differential signals allows transmission of very weak signals, and high-frequency signals to be transmitted are very weak signals.

Incidentally, a technique has been proposed with which, in a structure for connecting a suspension board provided with a circuit to a wiring circuit board, a significant decrease in the impedance at a connection point with respect to the differential impedance of differential signal wiring is avoided by removing a static capacitance component occurring between the metal reinforcing layer and the terminal portions by partially opening portions of the metal reinforcing layer provided on the wiring circuit board that overlap the terminal portions serving as the connection points of the boards, in advance (see PTL 1).

CITATION LIST

Patent Literature

PTL 1: JP-A-2004-363205

SUMMARY OF DISCLOSURE

Technical Problem

In view of this, it is proposed to use, in an optical communication module, a substrate provided with an opening by removing a portion of the metal reinforcing layer on the back surface side of the insulating layer of the opto-electronic hybrid substrate that faces a connection terminal of the electric wiring Y that serves as the connection point P, on the opposite side to the insulating layer. As shown in FIG. 15A, for example, use of the opto-electronic hybrid substrate 2 has been studied in which the metal reinforcing layer 7 of the opto-electronic hybrid substrate 2, which is part of an optical communication module, is provided with an opening 10 having a larger contour than a terminal by removing a portion facing each terminal at a leading end of the electric wiring Y (see FIG. 13). Note that a through-hole 50 is generally provided in the metal reinforcing layer 7 and is for optical coupling between an optical element and an optical waveguide in FIG. 15A.

Also, as shown in FIG. 15B, use of the opto-electronic hybrid substrate 2 has been studied in which a strip-shaped opening 11 is formed not only in the portions facing the terminals but also in portions extending along each wire of the electric wiring Y in the metal reinforcing layer 7.

However, with the above configuration, although electrical properties at the connection points P are improved, when terminals are to be crimped in order to connect a terminal on the opto-electronic hybrid substrate 2 side to a terminal on the other wiring board side, the metal reinforcing layer 7 has an opening on the opto-electronic hybrid substrate 2 side, and thus such a configuration is problematic in that the function of a reinforcing plate will be lost and the connection strength at the connection points P will become insufficient.

Thus, giving priority to ensuring mechanical strength, an opto-electronic hybrid substrate in which no opening is provided in a portion of the metal reinforcing layer 7 that serves as the connection point P and in a portion facing the electric wiring Y as shown in FIG. 16A, or an opto-electronic hybrid substrate in which an opening 11 is provided only in a portion facing the electric wiring Y other than the portion that serves as the connection point P as shown in FIG. 16B, for example, are still used. However, as described above, because there is demand for high-frequency signals and fine pitch wiring, there is strong demand for development of technology for improving electrical properties at the connection point P while ensuring mechanical strength.

This disclosure was made in view of such circumstances, and provides an optical communication module substrate in which connection strength at the connection points P is sufficiently ensured, and that has excellent electrical properties that are compatible with high-speed signal transmission.

Solution to Problem

That is, this disclosure provides [1] to [5] below.
[1] An optical communication module substrate including:
a wiring board; and
an opto-electronic hybrid substrate,
the wiring board and the opto-electronic hybrid substrate being connected to each other,
in which the wiring board includes an electric wiring X and a connection terminal of the electric wiring X,
the opto-electronic hybrid substrate includes an insulating layer, an electric circuit portion that is provided on a first surface side of the insulating layer and includes a pad for mounting an optical element, an electric wiring Y, and a connection terminal of the electric wiring Y, a metal reinforcing layer that is provided on a second surface side of the insulating layer, and an optical waveguide that is disposed on the second surface side of the insulating layer such that a portion of the optical waveguide overlaps the metal reinforcing layer,
the connection terminal of the wiring board and the connection terminal of the opto-electronic hybrid substrate are electrical connection points, and
a frame-shaped removal portion is formed by removing a portion of the metal reinforcing layer of the opto-electronic hybrid substrate that faces the connection terminal of the electric wiring Y that is provided on the opposite side to the insulating layer so as to surround each terminal.
[2] The optical communication module substrate according to [1] above, in which the metal reinforcing layer has at least one portion that is surrounded by the frame-shaped removal portion and is electrically connected to the connection terminal of the electric wiring Y.
[3] The optical communication module substrate according to [1] or [2] above, in which the portion of the metal reinforcing layer that faces the electric wiring Y provided on the opposite side to the insulating layer is removed in a strip shape along the electric wiring Y.
[4] The optical communication module substrate according to any one of [1] to [3] above, in which the connection terminal of the wiring board and the connection terminal of the opto-electronic hybrid substrate are disposed so as to overlap each other, and the connection terminals that overlap each other are electrically connected to each other directly or via a conductive member.
[5] The optical communication module substrate according to any one of [1] to [3] above, in which the connection terminal of the wiring board and the connection terminal of the opto-electronic hybrid substrate are electrically connected to each other via an electric connector provided between the wiring board and the opto-electronic hybrid substrate.

That is, as a result of intensive studies in order to resolve the above issues, the inventors of this disclosure found that, if a frame-shaped removal portion is formed so as to surround each terminal in the portion of the metal reinforcing layer of the opto-electronic hybrid substrate that constitutes an optical communication module substrate, the portion facing the connection terminal of the electric wiring Y, the mechanical strength of terminal portion is ensured due to the portion remaining in the frame of the metal reinforcing layer, and a surrounding region of the portion facing the terminal is disconnected from the metal reinforcing layer having a large area, suppressing effects on electrical properties.

Advantageous Effects of Disclosure

An optical communication module substrate according to this disclosure has excellent electrical properties, and has sufficient connection strength at a connection point P where a wiring board and an opto-electronic hybrid substrate are connected to each other, and impedance does not decrease at the connection point P, or the like. Also, because the performance of the optical communication module substrate is sufficiently high enough to be compatible with high-frequency signals and fine-pitch wiring, it is possible to provide an optical communication module for high-speed signal transmission with excellent reliability.

DESCRIPTION OF EMBODIMENT

Next, embodiments of this disclosure will be described in detail with reference to the drawings. However, this disclosure is not limited to the following embodiments.

Figure 1:
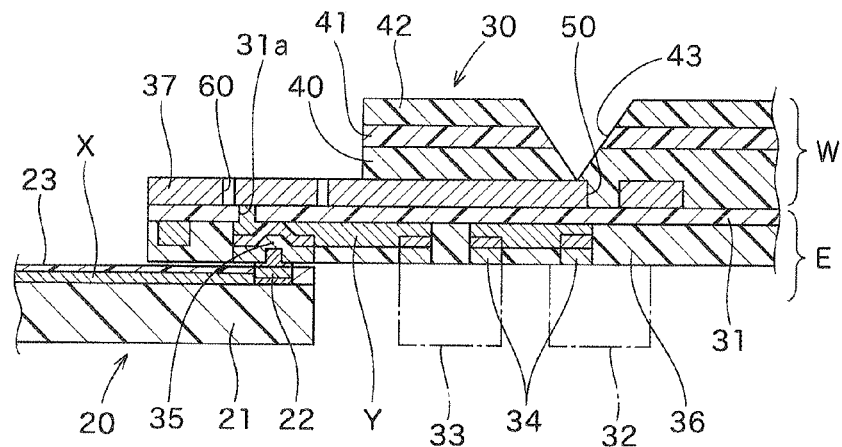
FIG. 1 is a schematic diagram illustrating a vertical cross section of a main portion of an optical communication module substrate according to an embodiment of this disclosure.

FIG. 1 is a partial vertical cross-sectional view schematically showing an embodiment of an optical communication module substrate according to this disclosure (which is cut along a direction in which an optical waveguide extends).

Figure 13:
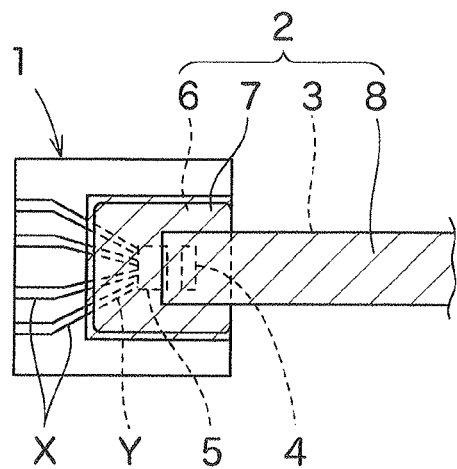
FIG. 13 is a partial schematic diagram illustrating one example of a general optical communication module.

Similarly to the above-described substrate used in a general optical communication module shown in FIG. 13, this optical communication module substrate is obtained by electrically connecting a wiring board 20 and an opto-electronic hybrid substrate 30 to each other into a single body.

The wiring board 20 is a wiring board for differential signal transmission, and an electric wiring X in which a plurality of pairs of electric wires for transmitting differential signals are arranged is formed on a surface of an insulating layer 21. Also, a connection terminal 22 for electrical connection to an electric wiring Y on the opto-electronic hybrid substrate 30 side is provided at an end portion of each wire in the electric wiring X, and the other portion is covered by a cover lay 23 in a state in which each terminal 22 is exposed.

Note that the wiring board 20 can be provided with various wiring patterns and pads, and the like for mounting or connecting appropriate electronic and electric components depending on applications of the wiring board 20. Further, although the wiring board 20 may be rigid or flexible, usually, the wiring board 20 is preferably rigid in consideration of connection strength to the opto-electronic hybrid substrate 30.

On the other hand, similarly to the wiring board 20, the opto-electronic hybrid substrate 30 connected to the wiring board 20 is for differential signal transmission, and a basic configuration of the opto-electronic hybrid substrate 30 is the same as the basic configuration of a general opto-electronic hybrid substrate. That is, an electric circuit portion E provided with the electric wiring Y in which a plurality of pairs of electric wires for transmitting differential signals are arranged, pads 34 for mounting an optical element 32, an IC 33 for driving the optical element 32 etc., and the like is provided on one surface (first surface) of one substantially strip-shaped insulating layer 31 as a substrate. A leading end of each wire in the electric wiring Y is a connection terminal 35 for electrical connection to the connection terminal 22 of the wiring board 20, and a portion, which requires insulation protection, other than these terminal portions and the like are covered by the cover lay 36. Note that the optical element 32 and the driving IC 33 may not be attached in the form of opto-electronic hybrid substrate, and are indicated using the dash-dot line.

A metal reinforcing layer 37 for reinforcing the strength of the insulating layer 31 is partially provided on the other surface (second surface) of the insulating layer 31, i.e., a surface of the insulating layer 31 on a side opposite to the side on which the electric circuit portion E is provided, in a region that needs to be reinforced. Further, an under cladding layer 40, a core 41, and an over cladding layer 42 are also stacked on the other surface of the insulating layer 31 in the stated order in an arrangement so as to partially overlap the metal reinforcing layer 37, and an optical waveguide W is formed by these three layers, namely, the under cladding layer 40, the core 41, and the over cladding layer 42. Note that a portion of the optical waveguide W is cut in an inclined surface, and the inclined surface serves as a light reflecting portion 43 for changing the traveling direction of optical signals transmitted via the core 41 by 90 degrees.

Figure 2:
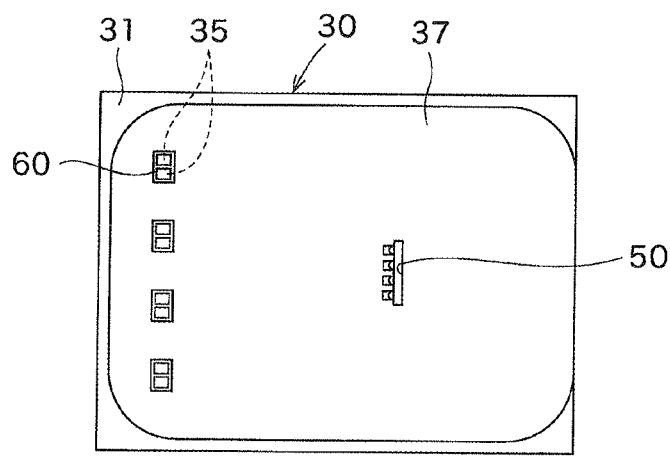
FIG. 2 is a plan view illustrating a metal reinforcing layer of an opto-electronic hybrid substrate that is used in the above optical communication module substrate as seen from the side where the metal reinforcing layer is formed.

As shown in FIG. 2, similarly to a conventional configuration, a through-hole 50 for optical coupling and the like is formed in the metal reinforcing layer 37 provided on the other surface side of the insulating layer 31, and as a result of removing the metal reinforcing layer 37 in a frame shape for each of the connection terminals 35 so as to surround the connection terminal 35, a frame-shaped removal portion 60 is formed in a portion facing the connection terminal 35 of the electric wiring Y provided on the opposite side to the insulating layer 31. This is a great characteristic of this disclosure.

Figure 3A:
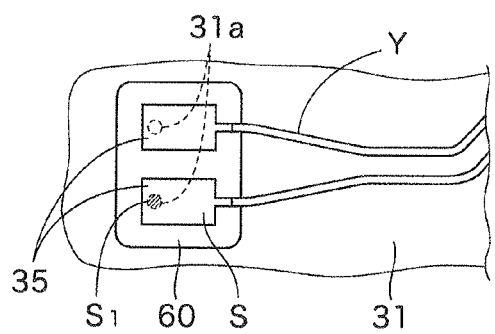
FIG. 3A is a partial plan view of a main portion of the metal reinforcing layer as seen from the side where an electric circuit portion of the opto-electronic hybrid substrate is formed.

When the portion of the metal reinforcing layer 37 where the frame-shaped removal portion 60 is formed is viewed in an enlarged manner from the opposite side to the insulating layer 31 on which the electric circuit portion E is formed, the connection terminals 35 are each surrounded by the frame-shaped removal portion 60 as shown in FIG. 3A.

Note that the portion of the metal reinforcing layer 37 where the frame-shaped removal portion 60 is formed is a small piece independent of the surrounding region. Thus, in order to prevent this portion from being electrically independent of a surrounding metal, through-holes 31a are formed in advance in the portion of the insulating layer 31 where the connection terminal 35 is formed, and these through-holes 31a are filled with a conductive material for electric wiring when forming the electric wiring, and the connection terminal 35 and the small piece portion of the metal reinforcing layer 37 are electrically connected and fixed to each other. This avoids capacitance between the small piece portion and the connection terminal 35. Also, the small piece portion is not peeled off from the insulating layer 31, and sufficient mechanical strength of this portion is ensured.

Figure 3B:
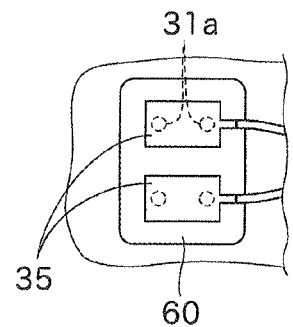
FIG. 3B is a partial plan view showing a modification example of a connection terminal portion of the electric circuit portion.

Although each through-hole 31a may be a hole with any shape in a plan view, if the through-hole 31a is circular, for example, the diameter of the through-hole 31a is preferably 5 to 200 μm, and more preferably 5 to 100 μm. Further, if the shape of the through-hole 31a in a plan view is a square, for example, one side of the through-hole 31a is preferably 5 to 200 μm, and more preferably 5 to 100 μm. Also, instead of providing one through-hole 31a in each connection terminal 35 as shown in FIG. 3A, two through-holes 31a may also be provided at two ends of each connection terminal 35 as shown in FIG. 3B, for example. Naturally, three or more through-holes 31a may be provided.

However, if the through-holes 31a are to be provided, depending on the manufacturing process, the surface of the connection terminal 35 provided with the through-hole 31a may be further recessed than the other portion, and this recessed portion is problematic in that connection failure will be likely to occur when connecting substrates. In view of this, if the through-hole 31a is to be formed, it is desired that the size and the arrangement of the through-hole 31a need to be considered such that (S)/(S1) is one or more, where the area of the recessed portion of the connection terminal 35 that is recessed through the formation of the through-hole 31a is S1, and the area of a flat portion that is not recessed is S, and specifically, (S)/(S1) is preferably three or more, and more preferably seven or more (see FIG. 3A for S and S1). Naturally, it is most preferable that, as a result of examining the manufacturing conditions, the through-hole 31a can be formed so as not to form such a recess because the entire area of the connection terminal 35 contributes to connecting substrates.

Step of Forming Opto-Electronic Hybrid Substrate

Next, one example of a step of obtaining the opto-electronic hybrid substrate 30 will be briefly described using specific materials as examples.

(1) Formation of Electric Circuit Portion E

Figure 4:
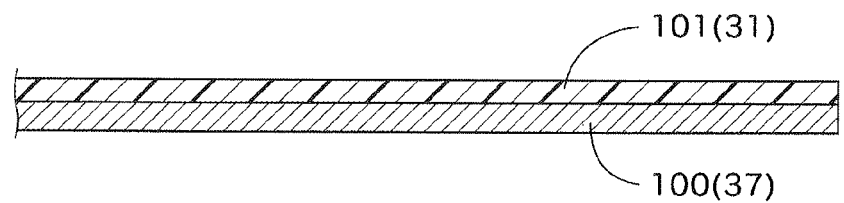
FIG. 4 is a diagram illustrating a process for manufacturing the opto-electronic hybrid substrate.

First, as shown in FIG. 4, an insulating resin layer 101, which will be the insulating layer 31, is formed by preparing a metal plate 100, which will be the metal reinforcing layer 37, and applying photosensitive insulating resin such as polyimide to the surface of the metal plate 100.

Although examples of the material of the metal plate 100 include stainless steel, copper, silver, aluminum, nickel, chromium, titanium, platinum, and gold; stainless steel is preferable from the viewpoint of strength, flexibility, and the like. Also, the thickness of the metal reinforcing layer 37 is preferably set within a range of 10 to 70 μm (more preferably 10 to 30 μm), for example.

Further, the insulating layer 31 having a predetermined pattern shape that includes the through-holes 31a for electrical connection to a small piece independent of the metal reinforcing layer 37, and the like is formed by performing photolithography (exposure, pre-baking, development, and curing) on the insulating resin layer 101. The thickness of the insulating layer 31 is preferably set within a range of 3 to 50 μm (more preferably 3 to 25 μm), for example (not shown).

Figure 5:
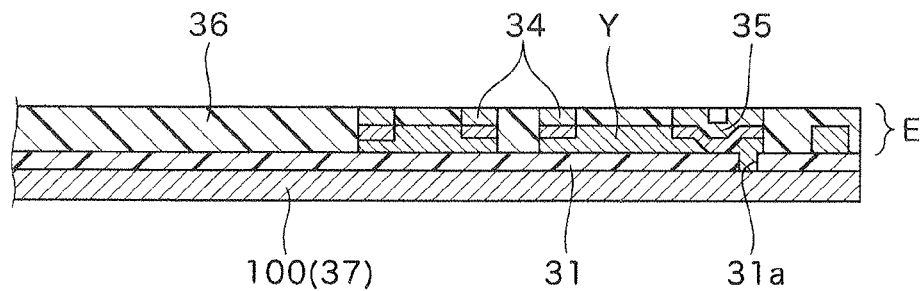
FIG. 5 is a diagram illustrating a process for manufacturing the opto-electronic hybrid substrate.

Then, a conductive layer made of a conductive material such as copper is formed on the insulating layer 31 through sputtering, electroless plating, or the like, and then, a conductive pattern such as the electric wiring Y, various pads 34, connection terminals 35, and the like is formed through necessary processes such as dry film resist lamination, exposure, and development. As shown in FIG. 5, a photosensitive insulating resin such as polyimide is then applied onto the resulting conductive pattern, and a cover lay 36 is formed on a portion that requires insulation protection in the same manner as the formation of the insulating layer 31.

Note that, in addition to copper, metal materials having high conductivity and malleability, such as chromium, aluminum, gold, and tantalum are suitably used as the conductive materials. Further, an alloy in which at least one of these metals (such as copper, chromium, aluminum, gold, and tantalum) is used can also be suitably used. The thickness of the conductive pattern such as the electric wiring Y is preferably set within a range of 3 to 30 μm (more preferably 3 to 18 μm). Further, the thickness of the cover lay 36 formed on the conductive pattern is preferably set within a range of 1 to 50 μm (more preferably 1 to 25 μm) in consideration of insulation, protection, and reinforcement of the electric wiring Y and the like.

The electric circuit portion E can be obtained by forming an electroplating layer using Ni, Au, or the like on a portion that is exposed from the cover lay 36 and is to be various pads 34 or the connection terminals 35 (see FIG. 5).

(2) Formation of Pattern of Metal Reinforcing Layer

Figure 6:
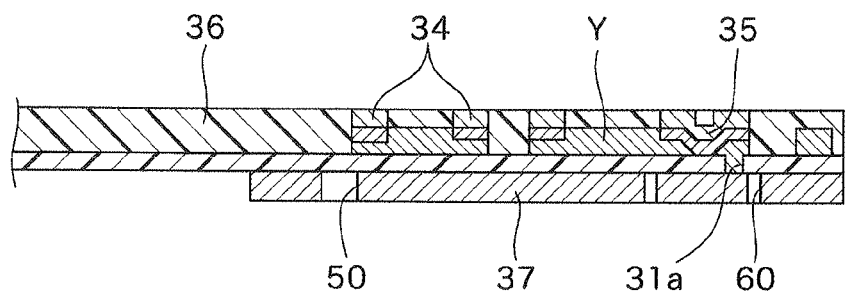
FIG. 6 is a diagram illustrating a process for manufacturing the opto-electronic hybrid substrate.

Next, a predetermined pattern shape is formed by removing unnecessary portions by performing etching processing (dry film resist lamination, exposure, development, etching, dry film resist peeling, and the like) on the metal reinforcing layer 37 that is opposite to the electric circuit portion E with the insulating layer 31 interposed between the electric circuit portion E and the metal reinforcing layer 37. As a result, as shown in FIG. 6, the through-hole 50 for optical coupling with the optical element 32 (see FIG. 1), the frame-shaped removal portions 60 in portions facing the connection terminals 35, and the like are formed.

(3) Formation of Optical Waveguide W

Next, the metal reinforcing layer 37 is caused to face upward by turning upside down the insulating layer 31 provided with the electric circuit portion E and the metal reinforcing layer 37. Then, the optical waveguide W can be obtained by stacking, using a known method, the under cladding layer 40, the core 41, and the over cladding layer 42 on a surface of the insulating layer 31 on the side where the metal reinforcing layer 37 is formed, in a state in which the under cladding layer 40, the core 41, and the over cladding layer 42 are patterned into predetermined patterns as needed.

Figure 7:
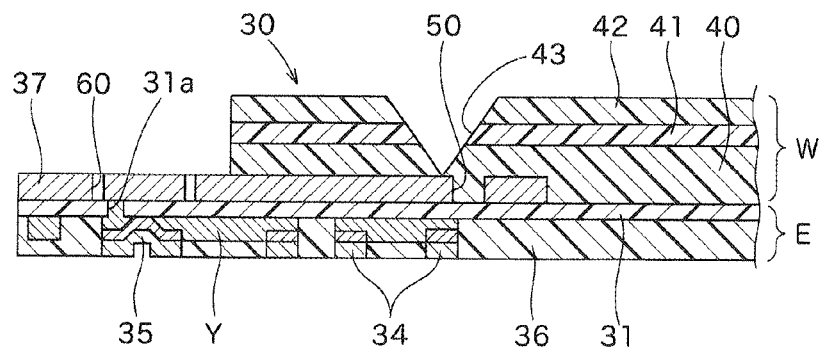
FIG. 7 is a diagram illustrating a process for manufacturing the opto-electronic hybrid substrate.

Then, as shown in FIG. 7, presuming optical coupling of the insulating layer 31 with the optical element 32 (see FIG. 1) provided on the electric circuit portion E side, a light reflecting surface 43 is formed by dicing, performing laser processing on, cutting, or the like a predetermined portion of the optical waveguide W into an inclined surface that is inclined 45 degrees with respect to the longitudinal direction of the core 41. As a result, it is possible to obtain the opto-electronic hybrid substrate 30 that is used as an optical communication module substrate. Note that the leading end side (not shown) of the optical waveguide W, that is opposite to the side on which the optical waveguide W faces the electric circuit portion E, may have a configuration in which an optical connector for connection to the other optical wiring member is attached to the leading end, or may have a configuration in which a similar electric circuit portion E' is also formed on the leading end side with the optical waveguide W interposed between the electric circuit portion E and the electric circuit portion E.

Step of Forming Optical Communication Module Substrate

As shown in FIG. 1, the opto-electronic hybrid substrate 30 obtained in this manner and the wiring board 20 are arranged such that the connection terminals 35 and 22 overlap each other, and joining portions of the connection terminals are electrically connected to each other by solder bumps or the like. The wiring board 20 and the opto-electronic hybrid substrate 30 are then stably assembled. As a result, a target optical communication module substrate can be obtained.

According to the optical communication module substrate, because the frame-shaped removal portions 60 that correspond to the connection terminals 35 are individually formed in the metal reinforcing layer 37 of the opto-electronic hybrid substrate 30, the mechanical strength of each terminal portion is ensured by the small piece portion remaining in the frame of the frame-shaped removal portion 60 of the metal reinforcing layer 37. Further, because the surrounding region of the small piece portion that faces the connection terminal 35 is insulated from the metal reinforcing layer with a large area, and is electrically connected to the connection terminal 35, effects of the small piece portion on electrical properties are significantly suppressed.

Figure 14:
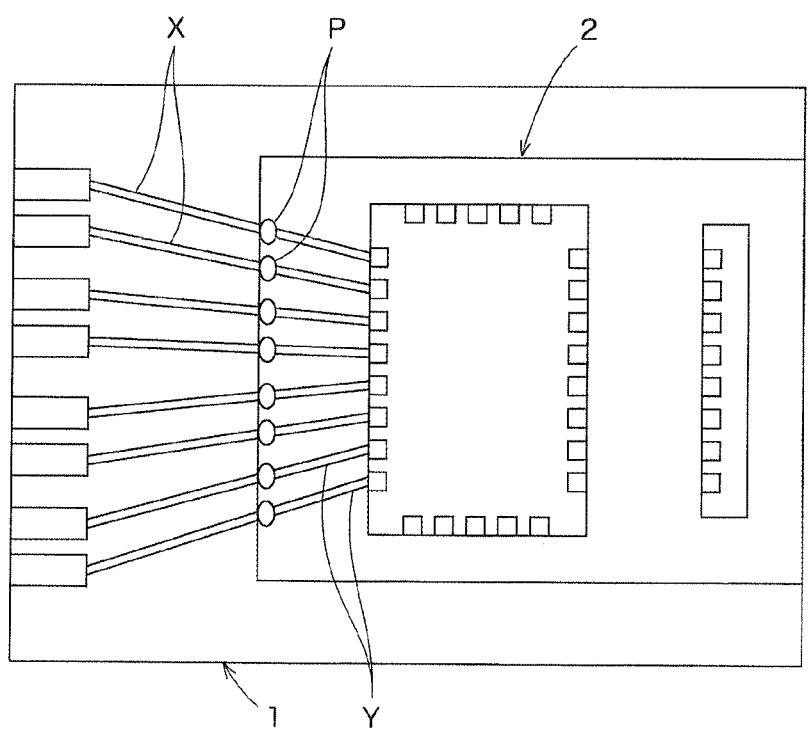
FIG. 14 is a schematic diagram illustrating issues of the optical communication module.
Figure 15A:
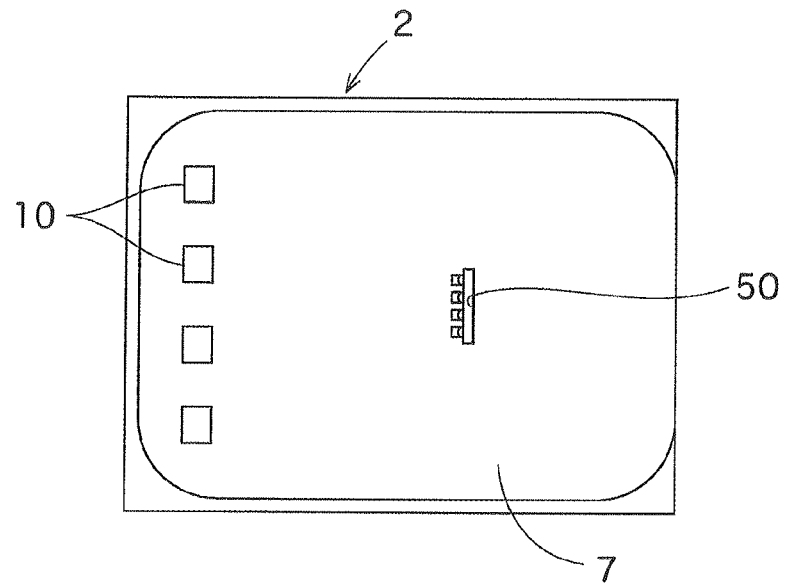
FIGS. 15A and 15B are diagrams illustrating the shape of the metal reinforcing layer in the above optical communication module.
Figure 15B:
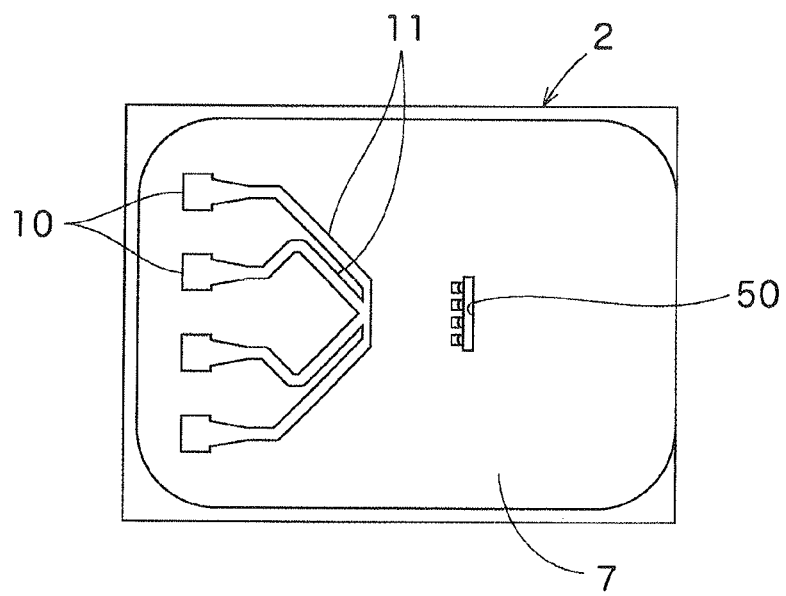
Figure 16A:
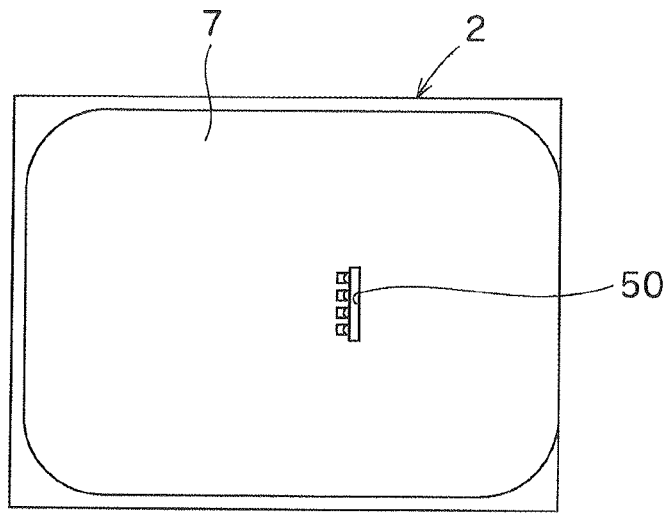
FIGS. 16A and 16B are diagrams illustrating the shape of the metal reinforcing layer in the above optical communication module.
Figure 16B:
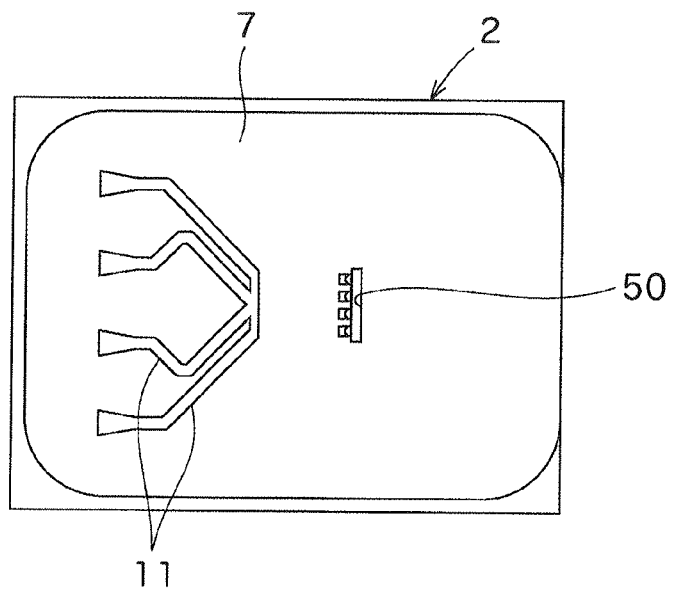

Therefore, the optical communication module substrate according to this disclosure has high connection strength and excellent electrical properties at the connection points P (see FIG. 14) between the wiring board 20 and the opto-electronic hybrid substrate 30, and the optical communication module substrate is highly compatible with high-frequency signals and fine-pitch wiring. Also, a highly reliable optical communication module for high-speed signal transmission can be provided using the optical communication module substrate according to this disclosure.

Figure 8:
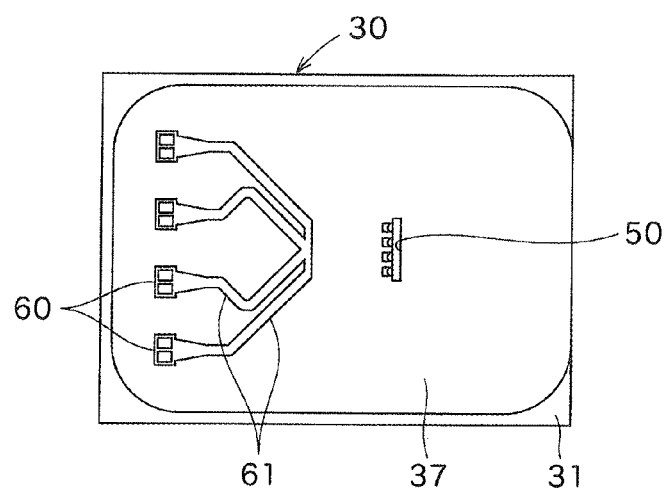
FIG. 8 is a plan view illustrating a modification example of the metal reinforcing layer of the opto-electronic hybrid substrate as seen from the side where the metal reinforcing layer is formed.

Note that, in the above example, as shown in FIG. 2, only the frame-shaped removal portions 60 surrounding the connection terminals 35 are used as removal portions of the metal reinforcing layer 37, apart from the through-hole 50 and the like that are generally provided. However, as shown in FIG. 8, for example, in order to reduce insertion loss of a wiring portion for differential signals in high frequency bands, a strip-shaped removal portion 61 extending along a wire of the electric wiring Y (not shown) can also be formed in a portion facing the wire, in addition to the frame-shaped removal portions 60.

Although the through-holes 31a are provided in the insulating layer 31 in advance such that there is no capacitance between the connection terminals 35 and the small piece portions that are independent of the metal reinforcing layer 37 on the inner side of the frame-shaped removal portion 60, and the small piece portions are each integrated with and connected to the connection terminals 35 in the above example, such an electrical connection structure need not be required in some cases.

Further, in the above example, when the optical communication module substrate is to be formed, the connection terminal 22 of the wiring board 20 and the connection terminal 35 of the opto-electronic hybrid substrate 30 are arranged such that the connection terminals 22 and 35 overlap each other, and joining portions of the connection terminals 22 and 35 are electrically connected to each other using solder bumps (see FIG. 1). However, the connection terminals 22 and 35 can be electrically connected to each other using not only solder bumps but also other metal bumps such as gold bumps. Further, electrical connection between the connection terminals can be achieved by interposing a conductive film such as an ACF (anisotropic conductive film). That is, there is no particular limitation on the type of conductive members for electrically connecting overlapping connection terminals 22 and 35. Also, the connection terminals 22 and 35 can be directly connected depending on the structures of the connection terminals 22 and 35.

Figure 9:
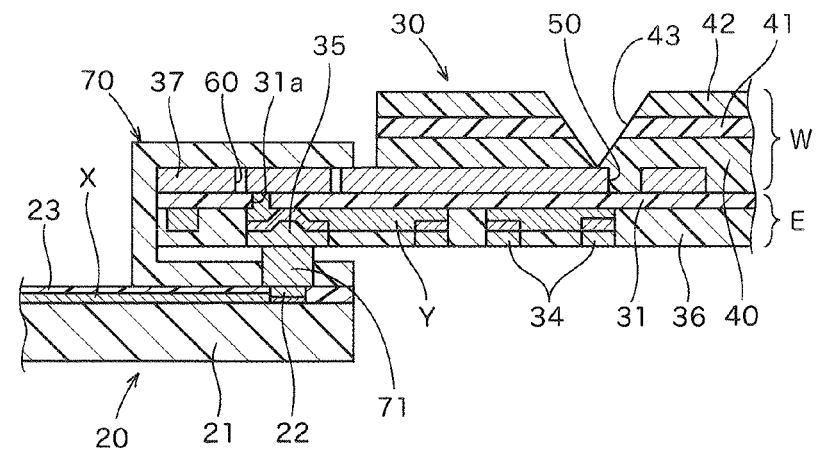
FIG. 9 is a schematic diagram illustrating a vertical cross section of a main portion of another embodiment of the optical communication module substrate according to this disclosure.

In order to electrically connect the connection terminals 22 and 35, an electric connector may be used instead of the conductive member as described above. As shown in FIG. 9, for example, the connection terminals 22 and 35 can be electrically connected to each other by attaching an electric connector (e.g., a ZIF connector or the like) 70 to one end portion of the opto-electronic hybrid substrate 30 where the connection terminals 35 are aligned, and interposing a connection terminal 71 of the electric connector 70 between the connection terminal 35 on the opto-electronic hybrid substrate 30 side and the connection terminal 22 on the wiring board 20 side.

Because the optical communication module substrate into which the electric connector 70 is incorporated is also provided with the frame-shaped removal portions 60 in the metal reinforcing layer 37 in this manner, this optical communication module substrate also has the same good effect as the optical communication module substrate shown in FIG. 1.

Note that the connection terminals can be electrically connected to each other in an arrangement in which a surface of the opto-electronic hybrid substrate 30 on a side where the metal reinforcing layer 37 is provided is caused to face the wiring board 20 by turning the opto-electronic hybrid substrate 30 upside down, depending on the structure of the electric connector 70. That is, the connection terminals can be electrically connected by connecting a first connection terminal of the electric connector 70 to a connection terminal 35 on the opto-electronic hybrid substrate 30 side, and connecting a second connection terminal of the electric connector 70 to a connection terminal 22 on the wiring board 20 side (not shown). In this case as well, because the frame-shaped removal portions 60 are provided in the metal reinforcing layer 37, this optical communication module substrate also have the same good effect as the optical communication module substrate shown in FIG. 1.

Naturally, there are cases where terminals do not overlap each other vertically and are displaced from each other, depending on the structure of the electric connector 70 to be used, the arrangement of the connection terminals 35 on the opto-electronic hybrid substrate 30 side, or the arrangement of the connection terminals 22 on the wiring board 20 side. However, because the metal reinforcing layer 37 of the opto-electronic hybrid substrate 30 is provided with the frame-shaped removal portions 60 in such a case, the optical communication module substrate also has the same good effects as the opto-electronic hybrid substrate shown in FIG. 1.

Further, the above examples are an example in which this disclosure is applied to an optical communication module substrate for differential signal transmission, and the optical communication module substrate need not be used for differential signal transmission, and may be used as a substrate for single ended transmission, for example. However, as described above, this disclosure is suitably used for high-speed signal transmission applications such as differential signal transmission because the advantages of this disclosure can be utilized in high-speed signal transmission presuming higher-frequency signal transmission and fine-pitch wiring.

Next, examples will be described together with comparative examples. However, this disclosure is not limited to the following examples.

EXAMPLES

Two types of tests were carried out in order to verify the degree of difference in the effect on electrical properties between a case where a frame-shaped removal portion is formed in a portion, which faces a connection terminal on the electric circuit portion side, of a metal reinforcing layer of an opto-electronic hybrid substrate that constitutes an optical communication module substrate and a case where no frame-shaped removal portion is formed.

Verification Test 1

Figure 10A:
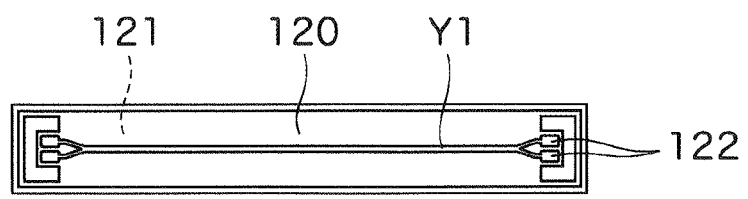
FIG. 10A is a diagram of samples that are used in a first verification test for evaluating electrical properties of examples and comparative examples of this disclosure.

First, a strip-shaped wiring board having a width of 10 mm and a length of 60 mm and shown in FIG. 10A was produced. The wiring board had a configuration in which a metal reinforcing layer 121 was formed on a back surface of the wiring board with an insulating layer 120 interposed between the wiring board and the metal reinforcing layer 121, and a pair of electric wirings Y1 for differential transmission are formed on a front surface of the wiring board, and connection terminals 122 are provided at two end portions of each electric wiring Y1 above.

The materials and thickness of each layer of the wiring board are as follows.
Insulating layer 120: polyimide, thickness was 10 μm
Metal reinforcing layer 121: stainless steel, thickness was 20 μm
Electric wiring Y1: copper, thickness was 6 μm (the connection terminals 122 were plated with gold)

Example Sample 1

Figure 10B:
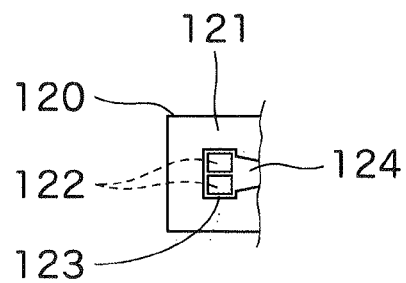
FIG. 10B is a diagram illustrating a configuration of an end portion of Example Sample 1 in the above samples.

As shown in FIG. 10B, Example Sample 1 was then prepared by forming, on the wiring board, frame-shaped removal portions 123 that individually surround the connection terminals 122 and strip-shaped removal portions 124 extending along the electric wirings Y1 in portions of the metal reinforcing layer 121 facing the connection terminals 122. Note that through-holes were formed at positions of the insulating layer 120 that corresponded to the connection terminals 122, the through-holes were filled with copper, which is the material for forming the electric wirings Y1, and thus small piece portions independent of the metal reinforcing layer 121 due to the frame-shaped removal portions 123 were electrically connected (see FIG. 3).

Comparative Example Sample 1

Figure 10C:
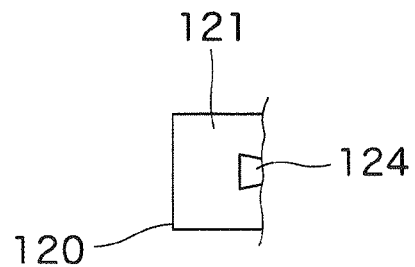
FIG. 10C is a diagram illustrating a configuration of an end portion of Comparative Example Sample 1 in the above samples.

Also, as shown in FIG. 10C, Comparative Example Sample 1 was prepared by forming, on the metal reinforcing layer 121 of the wiring board, only strip-shaped removal portions 124 extending along the electric wirings Y1 without forming frame-shaped removal portions 123 as in the above example sample.

Figure 11A:
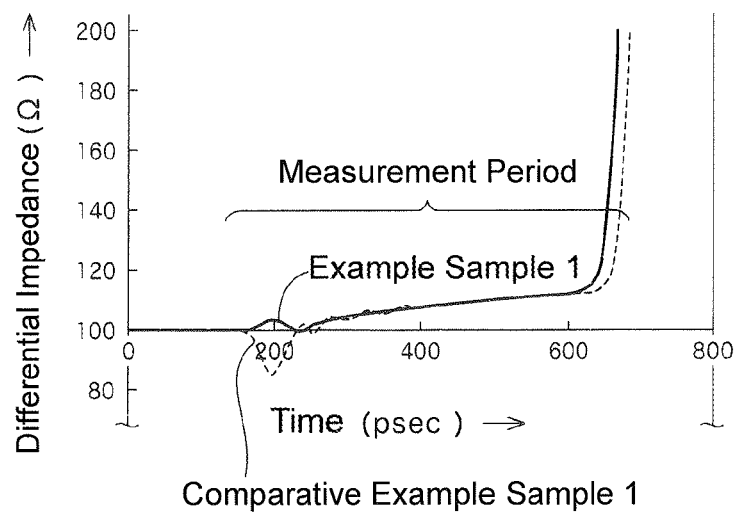
FIG. 11A is a property curve diagram showing difference impedance properties of Example Sample 1 and Comparative Example Sample 1 above.
Figure 11B:
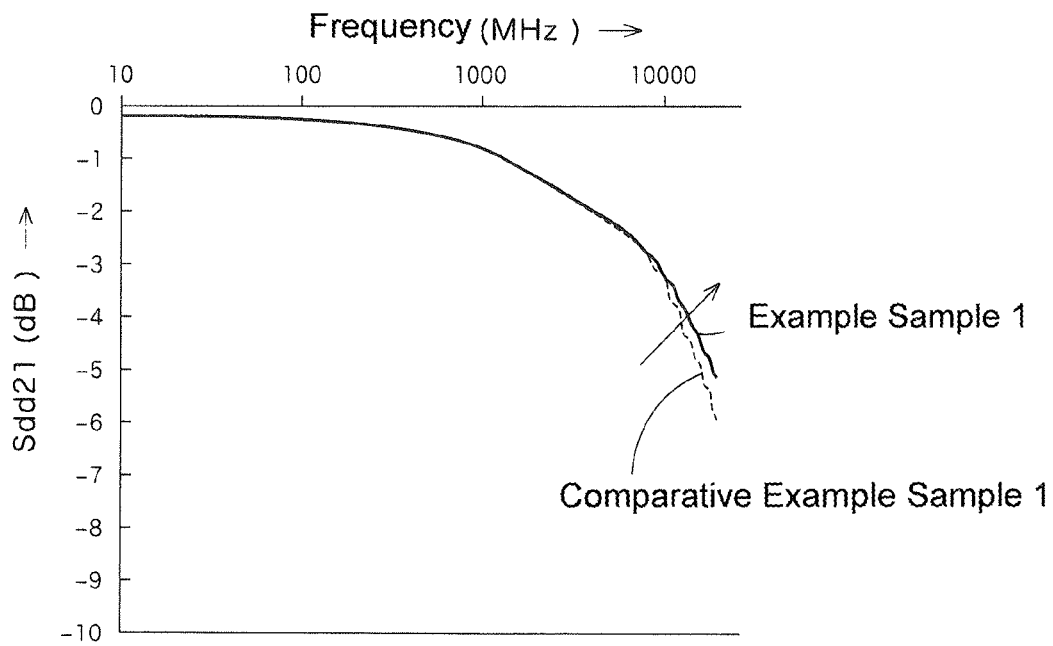
FIG. 11B is also a property curve diagram showing insertion loss of both samples in high frequency region.

Then, the following two measurements were performed on the Example Sample 1 and Comparative Example Sample 1, and electrical properties of the Example Sample 1 and Comparative Example Sample 1 were evaluated. Results of the measurements are shown in FIGS. 11A and 11B.

Evaluation of Impedance Matching at Connection Portions

For each sample, differential impedance (Ω) was measured through time-domain reflectometry (TDR) using an apparatus (manufactured by Tektronix, Inc.) constituted by the sampling oscilloscope DSA8200 and the TDR module 80E04.

The TDR involves input of a pulse wave having a fast rise time to a sample and measurement of impedance utilizing a reflection phenomenon occurring in an impedance mismatch section. As a result, it is possible to evaluate impedance matching at a connection portion.
[Evaluation of Quality of High-Frequency Signals through Measurement of Insertion Loss (Sdd21)]

For each sample, insertion loss (Sdd21) during differential signal input was measured using the 4-port vector network analyzer N5232A (manufactured by Keysight Technologies).

The insertion loss is obtained by expressing the ratio of the energy of signals transmitted to the energy of signals input to the sample in dB. As a result, it is possible to evaluate the quality of high-frequency signals.

Based on the above results, it is found that Example Sample 1 has excellent electrical properties, compared to Comparative Example Sample 1. That is, as shown in FIG. 11A, it is found that impedance decreases at the connection terminal portions of Comparative Example Sample 1, resulting in large impedance discontinuous points, whereas Example Sample 1 does not have such a discontinuous point.

Also, as shown in FIG. 11B, it is found that, in a frequency region above 1 GHz, Example Sample 1 has a smaller insertion loss caused by impedance discontinuity in the connection terminal portion, compared to Comparative Example Sample 1, and deterioration in signal quality is suppressed.

In Example Sample 1, because independent small pieces of the metal reinforcing layer 121 are left in the portions facing the connection terminals 122, it is conceivable that the mechanical strength is comparable to a case where the metal reinforcing layer 121 is not removed.

Therefore, it is found that, when the structure of Example Sample 1 above is applied to the optical communication module substrate according to this disclosure, the optical communication module substrate has high quality as well as having excellent electrical properties and high mechanical strength.

Verification Test 2

Example Sample 2

An optical communication module substrate (Example Sample 2) having the configuration shown in FIG. 9 was produced according to the above description. The structure and the like of each layer conform to the structure of a general optical communication module substrate, and will not be described in detail. Note that, in Example Sample 2, the number of connection terminals 35 for high-speed differential signals on the opto-electronic hybrid substrate 30 side is eight in one column, and eight frame-shaped removal portions 60 are formed (see FIG. 2). Also, a ZIF connector (FH43B-21S-0.2SHW manufactured by Hirose Electric Co., Ltd.) was used as the electric connector 70 for connecting the connection terminals 35 to the connection terminals 22 on the wiring board 20 side.

Comparative Example Sample 2

An optical communication module substrate (Comparative Example Sample 2) was produced in, the same manner as Example Sample 2, except that the frame-shaped removal portion 60 was not formed.

Figure 12:
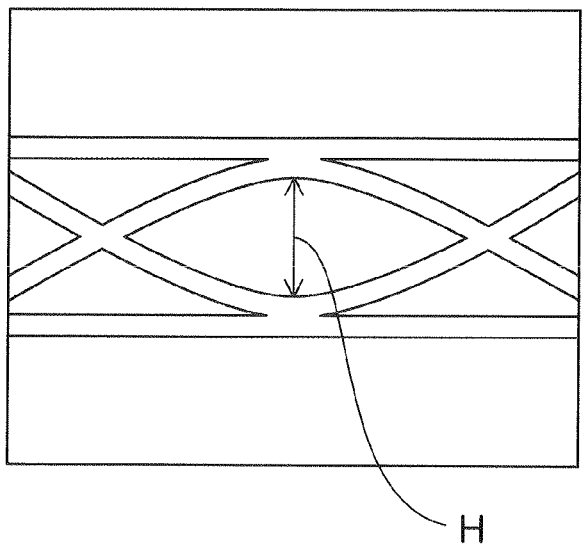
FIG. 12 is a diagram illustrating an evaluation method used in a second verification test for evaluating electrical properties of examples and comparative examples of this disclosure.

The pulse pattern generator M8045A (manufactured by Keysight Technologies) was used to input digital signals of 6 Gbps, 8 Gbps, and 10 Gbps from the opto-electronic hybrid substrate 30 side of each sample (optical communication module substrate), and output signal waveforms extracted from the wiring board 20 side were observed using the sampling oscilloscope N1000A and the module 54754A (both the N1000A and the 54754A are manufactured by Keysight Technologies). Note that an eye pattern was obtained by superimposing the observed 3000 signal waveforms for each sample. In each eye pattern, the value at which the voltage width at an eye opening is the largest was regarded as the "eye height" (indicated by H in FIG. 12), and the eye heights H of samples were compared. The larger the eye height H is, the better the transmission signal quality is maintained. The results of the comparison are as follows.

TABLE 1

| Types of Transmission Signals | Eye Height (voltage width, mV) | | |
|---|---|---|---|
| | 6 Gbps | 8 Gbps | 10 Gbps |
| Example Sample 2 | 250 | 220 | 180 |
| Comparative Example Sample 2 | 240 | 190 | 140 |

Based on the above results, it is found that Example Sample 2 further suppresses deterioration in the quality of transmission signals and has excellent optical communication performance, compared to the Comparative Example Sample 2.

Note that, although specific embodiments of this disclosure have been described in the above examples, the examples are to be considered in all respects merely as examples and not limiting. Various modifications apparent to those skilled in the art are all intended to be within the scope of this disclosure.

INDUSTRIAL APPLICABILITY

The optical communication module substrate according to this disclosure has sufficient connection strength at the connection points P between the wiring board and the opto-electronic hybrid substrate, and have excellent electrical properties that are compatible with high-speed signal transmission, and can be widely used in high-speed signal transmission technology using differential signal transmission or the like.

REFERENCE SIGNS LIST

30 Opto-electronic hybrid substrate
31 Insulating layer
35 Connection terminal
37 Metal reinforcing layer
60 Frame-shaped removal portion

The invention claimed is:

1. An optical communication module substrate comprising:
    a wiring board; and
    an opto-electronic hybrid substrate,
    the wiring board and the opto-electronic hybrid substrate being connected to each other,
    wherein the wiring board includes an electric wiring X and a connection terminal of the electric wiring X,
    the opto-electronic hybrid substrate includes an insulating layer, an electric circuit portion that is provided on a first surface side of the insulating layer and includes a pad for mounting an optical element, an electric wiring Y, and a connection terminal of the electric wiring Y, a metal reinforcing layer that is provided on a second surface side of the insulating layer, and an optical waveguide that is disposed on the second surface side of the insulating layer such that a portion of the optical waveguide overlaps the metal reinforcing layer,
    the connection terminal of the wiring board and the connection terminal of the opto-electronic hybrid substrate are electrical connection points, and
    a frame-shaped removal portion is formed by removing a portion of the metal reinforcing layer of the opto-electronic hybrid substrate that faces the connection terminal of the electric wiring Y that is provided on the opposite side to the insulating layer so as to surround each terminal, and
    an inner side of the frame-shaped removal portion is a small piece independent of a surrounding region.

2. The optical communication module substrate according to claim 1,
    wherein the metal reinforcing layer has at least one portion that is surrounded by the frame-shaped removal portion and is electrically connected to the connection terminal of the electric wiring Y.

3. The optical communication module substrate according to claim 1,
    wherein the portion of the metal reinforcing layer that faces the electric wiring Y provided on the opposite side to the insulating layer is removed in a strip shape along the electric wiring Y.

4. The optical communication module substrate according to claim 1,
    wherein the connection terminal of the wiring board and the connection terminal of the opto-electronic hybrid substrate are disposed so as to overlap each other, and the connection terminals that overlap each other are electrically connected to each other directly or via a conductive member.

5. The optical communication module substrate according to claim 1,
    wherein the connection terminal of the wiring board and the connection terminal of the opto-electronic hybrid substrate are electrically connected to each other via an electric connector provided between the wiring board and the opto-electronic hybrid substrate.

* * * * *